(12) United States Patent
Chen et al.

(10) Patent No.: US 6,960,496 B2
(45) Date of Patent: Nov. 1, 2005

(54) METHOD OF DAMASCENE PROCESS FLOW (75) Inventors: Chao-Cheng Chen, Chong-Ling (TW); Kang-Cheng Lin, Yunghe (TW)

(73) Assignee: Taiwan Semiconductor Manufacturing, Hsin-Chu (TW)

( * ) Notice: Subject to any disclaimer, the term of this patent is extended or adjusted under 35 U.S.C. 154(b) by 94 days.

(21) Appl. No.: 10/407,095

(22) Filed: Apr. 3, 2003

(65) Prior Publication Data

US 2004/0198035 A1 Oct. 7, 2004

(51) Int. Cl.[7] .............................................. H01L 21/332
(52) U.S. Cl. ...................................... 438/140; 438/638
(58) Field of Search ................................. 438/140, 629, 438/634, 637, 638

(56) References Cited

U.S. PATENT DOCUMENTS

| | | | | |
|---|---|---|---|---|
| 6,033,984 | A | | 3/2000 | Schnabel et al. ............ 438/638 |
| 6,207,555 | B1 | | 3/2001 | Ross ........................... 438/633 |
| 6,300,223 | B1 | * | 10/2001 | Chang et al. ................ 438/460 |
| 6,362,524 | B1 | | 3/2002 | Blish et al. .................. 257/734 |
| 6,451,688 | B1 | | 9/2002 | Shimpuku ................... 438/624 |
| 6,537,849 | B1 | * | 3/2003 | Tsai et al. .................... 438/637 |
| 2003/0218324 | A1 | * | 11/2003 | Kurimoto et al. ........... 438/637 |
| 2004/0075174 | A1 | * | 4/2004 | Tamaru et al. ............... 257/758 |

OTHER PUBLICATIONS

P. Wrschka et al., "Chemical Mechanical Planarization Of Copper Damascene Structures", Journal of The Electrochemical Society, 147 (2) 706–712 (2000), pp. 706–712.

Jin–Young Kim et al., "The Photoresist Thickness Variation due To Local And Global Topography", Physica Department, Hanyang University, Korea, The International Society For Optical Engineers 2001.

Steve Lassig et al., "Selective Removal Strategies For Low k Dual Damascene", Lam Research Corporation, Fremont, CA (Semiconductor Fabtech), pp. 185–190, no date.

* cited by examiner

Primary Examiner—Chandra Chaudhari
(74) Attorney, Agent, or Firm—Duane Morris LLP (57) ABSTRACT A method of integrated circuit fabrication includes first forming at least one via in an insulting layer, and thereafter forming at least one trench-like structure separately. After a via is formed in an insulating layer, a layer of resist material is formed on the surface of the insulting layer and substantially filled the via. This step is followed by patterning at least one trench-like structure on the resist layer, and the trench-like structure is etched to the desired level. In some other embodiments, at least one trench-like structure is formed before at least one via is formed. An integrated circuit is manufactured by the aforementioned methods.

17 Claims, 7 Drawing Sheets

FIG. 10D

METHOD OF DAMASCENE PROCESS FLOW

FIELD OF THE INVENTION

The present invention relates to integrated circuit fabrication and more particularly to a damascene process to form vias and trench-like structures and an integrated circuit manufactured thereby.

DESCRIPTION OF RELATED ART

The advances of semiconductor manufacturing technology lead to continuous increase of the operating speed and decrease of the size of integrated circuits. An integrated circuit, comprising many electronic components such as transistors and capacitors, is typically formed by multiple levels of interconnects. Patterned conductive material on one interconnect level is electrically insulated from patterned conductive material on another interconnect level by an insulating layer made of dielectric material such as silicon dioxide. Each level of interconnect comprises trenches of various shapes and sizes. Different levels of interconnect are vertically integrated and electrically connected with each other by structures often referred to as vias. In addition, some circuit units are separated and protected from contamination and electromagnetic interference by seal rings filled with conductive material. Seal rings are trench-like groove shaped spaces surrounding circuit units. Moreover, other trench-like structures such as a mask number or other indicia are formed on a wafer for various purposes.

The interconnect on each level and between different levels, and seal rings are conventionally filled with aluminum and aluminum alloy. Traditionally, a layer of aluminum or aluminum alloy is deposited on the top of an insulating layer. After photomasking, all aluminum is etched away except the patterned trenches, vias, and seal rings. In order to increase the operating speed of integrated circuit while reducing power consumption, conductive material with lower electrical resistance such as copper is used to replace aluminum. However, copper is difficult to etch in a semiconductor environment. As a result, a damascene approach is employed, which comprises etching openings for structures such as trenches, vias, and seal rings in the insulating layer and subsequently filling the trenches, vias, and seal rings with conductive material, such as copper. Then the conductive material is polished down to the surface of the insulating layer by, for example, chemical mechanical polishing (CMP) to form the desired metal pattern.

Figure 1:
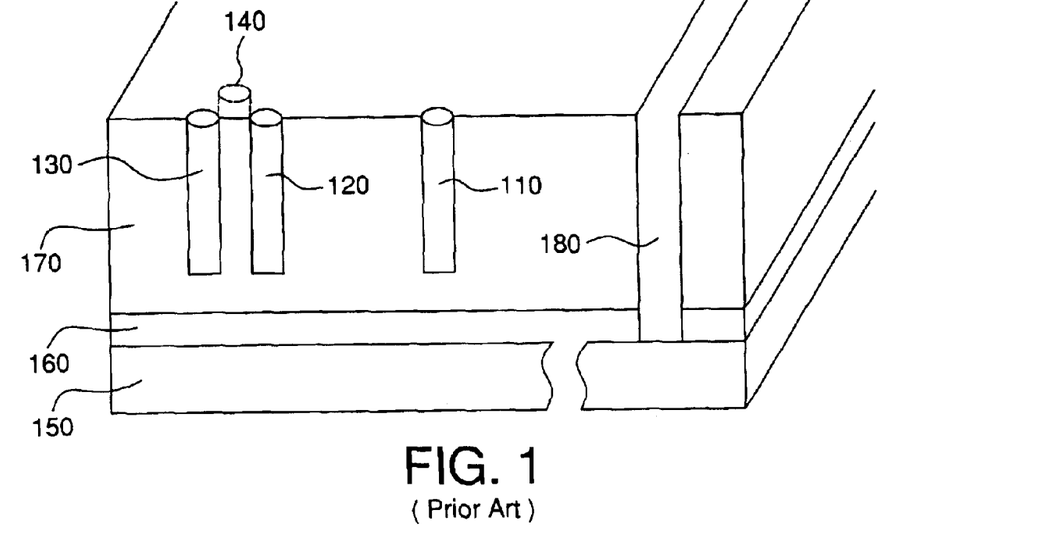
FIG. 1 illustrates a prior art cross-sectional view of a substrate having dense vias, an isolated via, and a seal ring manufactured by a conventional process.
Figure 2:
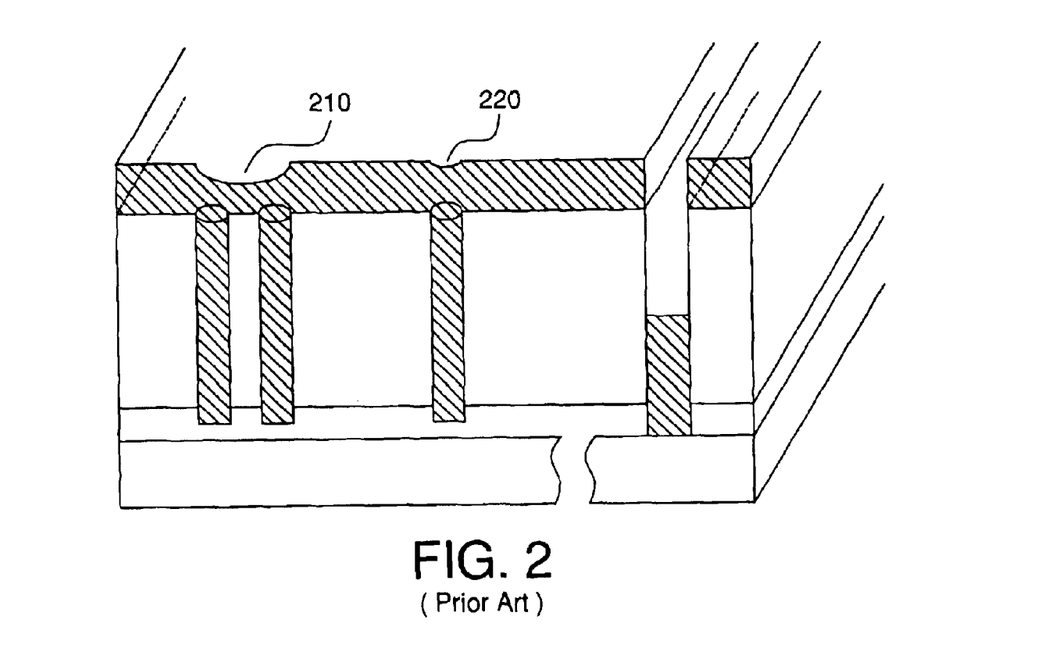
FIG. 2 illustrates the substrate of FIG. 1, with the vias and seal ring filled up with resist.

FIG. 1 shows a conventional damascene process. Vias and trench-like structures are conventionally photomasked and etched at the same time to save steps of manufacturing processing. However, because the etch rate for trench-like structures such as seal rings is faster than the etch rate for vias, a disadvantage is that a trench-like structure 180 may punch through an insulating layer 170 and an etch stop layer 160 to expose conductive material 150 on the underlying level of interconnect while vias 110, 120, 130, and 140 have not been etched to the desired depth, as illustrated in FIG. 1. The exposure of conductive material 150 such as copper can cause problems such as contamination and wafer arcing. Moreover, as shown in FIG. 2, uneven topography between the area of dense vias (deeper concave surface 210) and the area of an isolated via (shallower concave surface 220), resulting from more resist being taken to fill up dense vias, may present difficulty for the following photomasking to form interconnect trenches. In order to obtain a planarized surface of the resist layer for the following photomasking to form interconnect trenches, several iteration of deposition and etching of resist are required to even the difference of topography between the area of dense vias and the area of isolated vias. The repeated coating and etch back steps increase costs. Improved damascene techniques are desired.

SUMMARY OF THE INVENTION

A method for manufacturing an integrated circuit comprises providing an insulating layer overlying a layer of conductive material; forming at least one via in the insulating layer; forming a first layer of resist material on the surface of the insulating layer, which substantially fills the via; patterning at least one trench-like structure on said first resist layer; and etching the trench-like structure. In some other embodiments, at least one trench-like structure is formed before at least one via is formed. An integrated circuit is manufactured by the aforementioned methods.

BRIEF DESCRIPTION OF THE DRAWINGS

A more complete understanding of the present invention can be obtained by reference to the detailed description of embodiments in conjunction with the accompanying drawings, in which.

DETAILED DESCRIPTION OF THE INVENTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

One exemplary embodiment of the present invention provides a method of first forming at least one via in an insulating layer, and thereafter forming at least one trench-like structure separately. The term "trench-like structure" is defined herein to include, but is not limited to, a seal ring, a portion of a seal ring, mask number or other indicia, and the like. "A trench-like structure in a seal ring area" refers to a seal ring or a portion of a seal ring. The trench-like structure, however, does not include trenches for circuit interconnect. After a via is formed in an insulating layer, a layer of resist material is deposited on the surface of the insulting layer and substantially fills the via. This is followed by patterning at least one trench-like structure on the resist layer. Then the trench-like structure is etched to the desired level. The remaining resist is removed down to approximately the surface of the insulating layer. A second layer of resist material is deposited on the top of the insulating layer.

Figure 3:
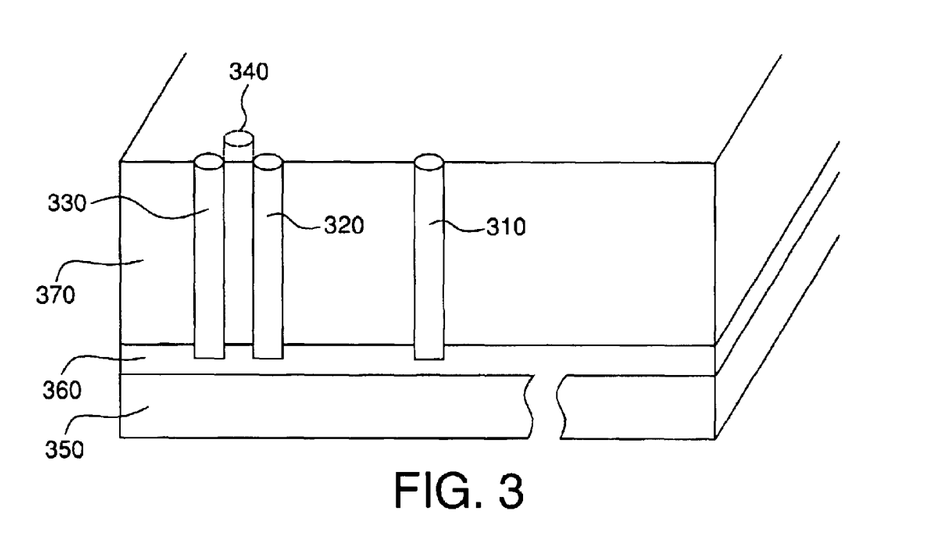
FIG. 3 illustrates a cross-sectional view of a substrate having dense vias, and an isolated via.

In an embodiment, as shown in FIG. 3, an insulating layer 370 is deposited over an etch stop layer 360. The thickness of the dielectric layer 370 ranges from 5,000 to 10,000 Angstroms. The etch stop layer 360 is deposited on a conductive interconnect layer 350. The conductive interconnect layer, in some embodiments, can be separated into several regions such as a circuit region and a seal ring region. An isolated via 310 and an area of dense vias comprising vias 320, 330, and 340 are formed in the insulating layer 370 and part of the etch stop layer 360 over the circuit region of the conductive interconnect layer 350.

In some embodiments, the insulating layer 370 comprises silicon dioxide, silicon oxynitride, phosphosilicate glass, borosilicate glass, or fluorinated silicate glass. The etch stop layer 360 can be silicon nitride. The conductive interconnect layer 350 comprises copper, aluminum, aluminum alloy, gold, silver, titanium, tungsten, or any combination of them. Silicon dioxide can be formed by thermal oxidation or be deposited by chemical vapor deposition (CVD). Thermal oxidation can be conducted either at atmospheric pressure or at high pressure. And the temperature is usually between 900 and 1200 degree Celsius to obtain qualified silicon dioxide. Silicon dioxide can also be deposited from tetraethyl orthosilicate (TEOS) by plasma enhanced CVD (PECDV). Another option is the reaction of silane with nitrous oxide in an argon plasma. Silicon nitride is usually deposited by low pressure chemical vapor deposition (LPCVD) or plasma enhanced chemical vapor deposition (PECVD).

In order to increase the operating speed of integrated circuits while reducing power consumption, conductive material with lower electrical resistance such as copper is used to replace aluminum and aluminum alloy. A copper layer can be formed by first depositing a copper seed layer followed by electroplating. In other embodiments, different materials suitable for damascene processing are used.

Figure 4:
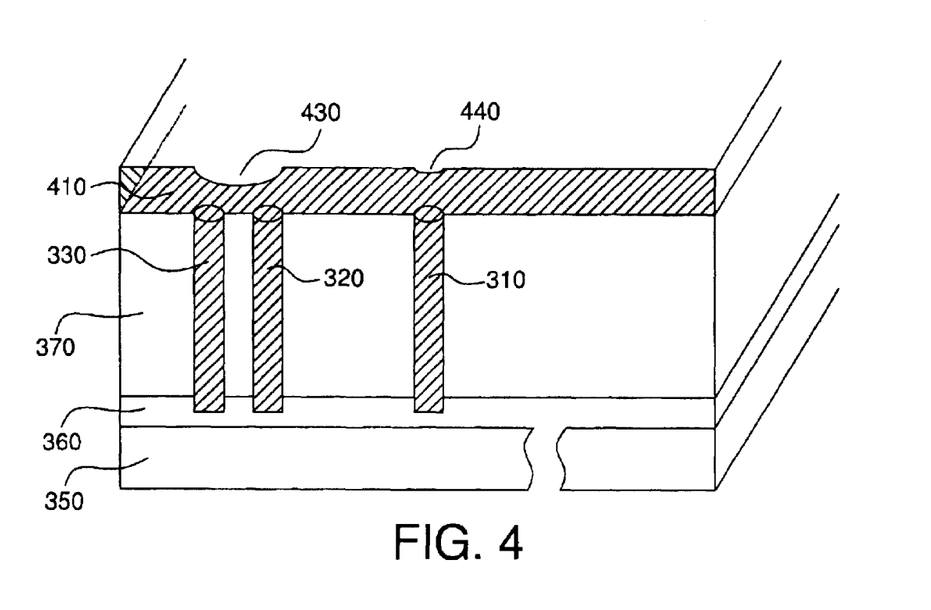
FIG. 4 illustrates a cross-sectional view of the substrate of FIG. 3, wherein a first layer of resist material is deposited on the substrate and fills up the vias.

As illustrated in FIG. 4, a first layer of resist material 410 is deposited on the surface of the insulating layer 370 and substantially fills vias 310, 320, 330, and 340. Because of the dense distribution of vias 320, 330, and 340 taking more resist to fill up vias, the topography of the dense via area (deeper concave surface 430) is lower than the topography of the area of an isolated via 310 (shallower concave surface 440).

Resist material means any energy-sensitive material that can be formed on a substrate to create a pattern during integrated circuit manufacturing. Resist material may contain, among many other ingredients, energy-sensitive polymers which change from unpolymerized to polymerized after exposure to an energy source for a negative resist; and vice versa for positive resist. After cleaning and dehydrating the surface of insulating layer 370, in some embodiments, resist is deposited in the center of a wafer which is placed on a vacuum chuck. When the resist spreads out and reaches its specified diameter, the chuck rapidly spins to uniformly distribute resist to the wafer edge and to throw off excess resist. Resist material generally is tailored to a specific exposure source. In some embodiments, 248 nm resist material for deep ultraviolet at 248 nm or 193 nm resist material for deep ultraviolet at 193 nm is employed. A typical resist layer varies from 0.5 to 1.5 $\mu$m in thickness and has a uniformity of plus or minus only 0.01 $\mu$m to avoid causing image distortions during the exposure and etch processes.

Figure 5:
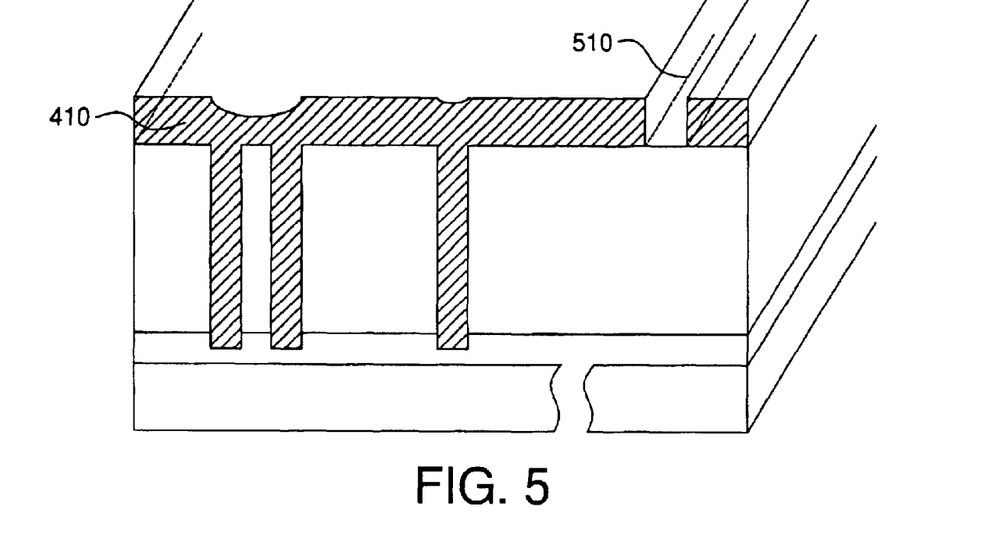
FIG. 5 illustrates a cross-sectional view of the substrate of FIG. 4, wherein a seal ring is photomasked and developed.

In FIG. 5, by applying a suitable photolithographic technique, an additional photomask (not shown) is used to form a trench-like structure in an seal ring area. A photomask typically comprises a substantially transparent base material such as quartz with an opaque layer having the desired pattern formed thereon. For example, chrome has long been used to make the opaque layer. When device features come to a dimension below 1 micrometer ($\mu$m) level, diffraction effects, however, become significant. The blending of two diffraction pattern coming out of closed features makes the pattern unresolved. As a result, in other embodiments, an attenuated phase shifting mask and chromeless phase shifting mask are used. The additional photomask with the pattern of a trench-like structure thereon is placed right above the resist layer 410. Then, the exposure system, using radiation such as I line at 365 nm and deep ultraviolet at 193 nm, transfer patterns on the photomask onto the surface of the resist layer 410.

After exposure, the portion of resist layer corresponding to the trench-like structure either becomes or remains unpolymerized depending on whether the positive or negative resist is used. A development process is employed to make the resist layer 410 an exact copy of the pattern that is on the photomask, for example a trench-like structure. In some embodiments, a chemical resolution is applied to dissolve and remove the unpolymerized portion of the resist layer 410. In other embodiments, dry plasma etch is used, where ions energized by a plasma field hit the portion of resist layer and chemically dissolve it. After development, a feature 510 for the trench-like structure is patterned on the resist layer 410.

Figure 6:
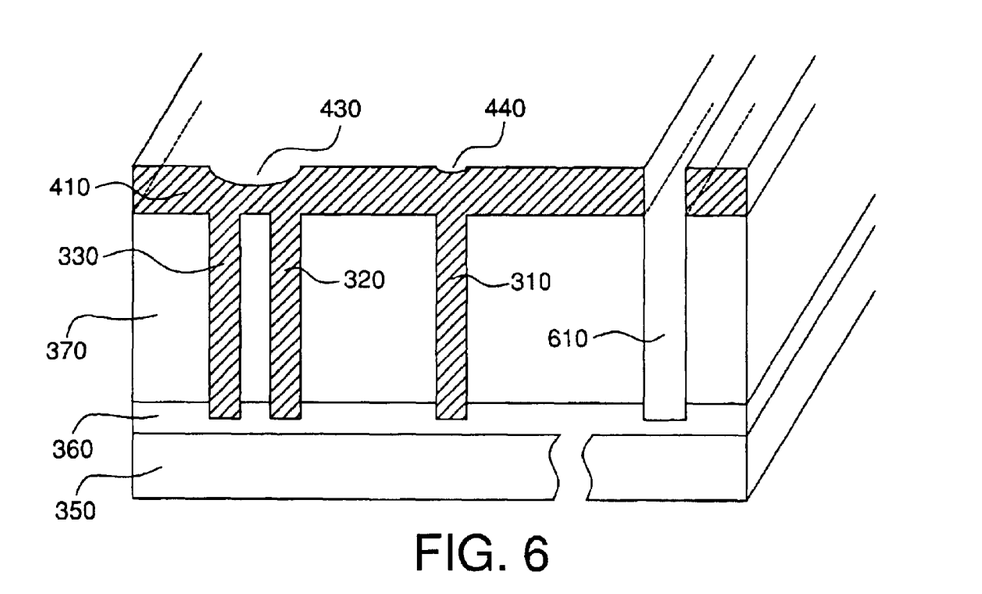
FIG. 6 illustrates a cross-sectional view of the substrate of FIG. 5, wherein a seal ring is separately formed by etching after the vias.

Turing to FIG. 6, a trench-like structure 610 in a seal ring area is formed by etching. For silicon dioxide, the basic etchant is hydrofluoric acid (HF). In practice, the HF is usually mixed with water or ammonium fluoride and water to create a reasonable etch rate. Because wet etching is isotropic which results in sloped sidewalls, in some other embodiments, the process of etching can be implemented by using an anisotropic plasma etching where $C_4F_8$, $CH_2F_2$ or $C_5F_8$ is used as an etchant, the pressure is about 20 m Torr, and the energy supply ranges from about 200 to 1200 Watts. The etching rate can range from 2,000 to 3,000 Angstroms per minute. Accordingly, the trench-like structure 610 in the seal ring area is formed separately from vias 310–340. As a result, differences of etching rate between trench-like structures and vias, which may cause trench-like structures to punch through the etch stop layer 360 and expose the conductive interconnect layer 350 such as a copper layer, do not generate any problem. Moreover, operating windows for photomasking and etching are wider by separated formation of vias and trench-like structures. For example, the depth of focus is about 0.3 μm when vias and trench-like structures are formed at the same time; whereas the depth of focus is larger than 0.4 μm for the lithographic process of vias and trench-like structures respectively when they are formed separately as in the present invention.

Figure 7:
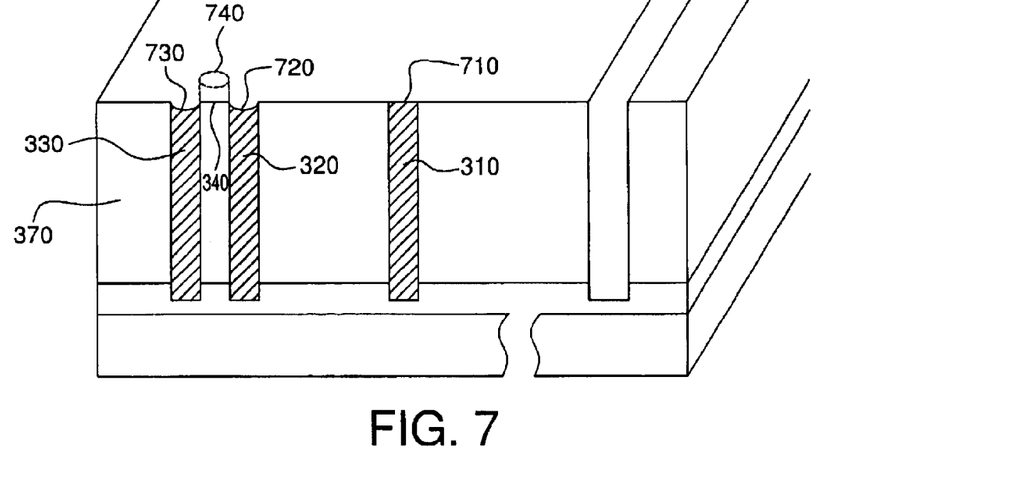
FIG. 7 illustrates a cross-sectional view of the substrate of FIG. 6, wherein the first layer of resist material is partially removed.

As shown in FIG. 7, the first resist layer 410 is then removed down to approximately the surface of the insulating layer 370, leaving vias 310–340 substantially filled with resist. The deep concave surface 430 becomes shallower concave surfaces 720, 730, and 740 after etching back the first resist layer 410. In some embodiments, the resist layer 410 is removed by wet chemical processing. Other embodiments use anisotropic dry etching by plasma. In some embodiments, the wafer is placed in a chamber and oxygen is introduced. Oxygen, which is energized by the plasma field to a high energy state, oxidizes the resist material to gases that are removed from the chamber by the vacuum pump. Because the top surface of insulating layer 370 limits the removal of resist layer 410, the difference of topography between vias 320, 330, and 340 in dense area and the isolated via 310 becomes smaller.

Figure 8:
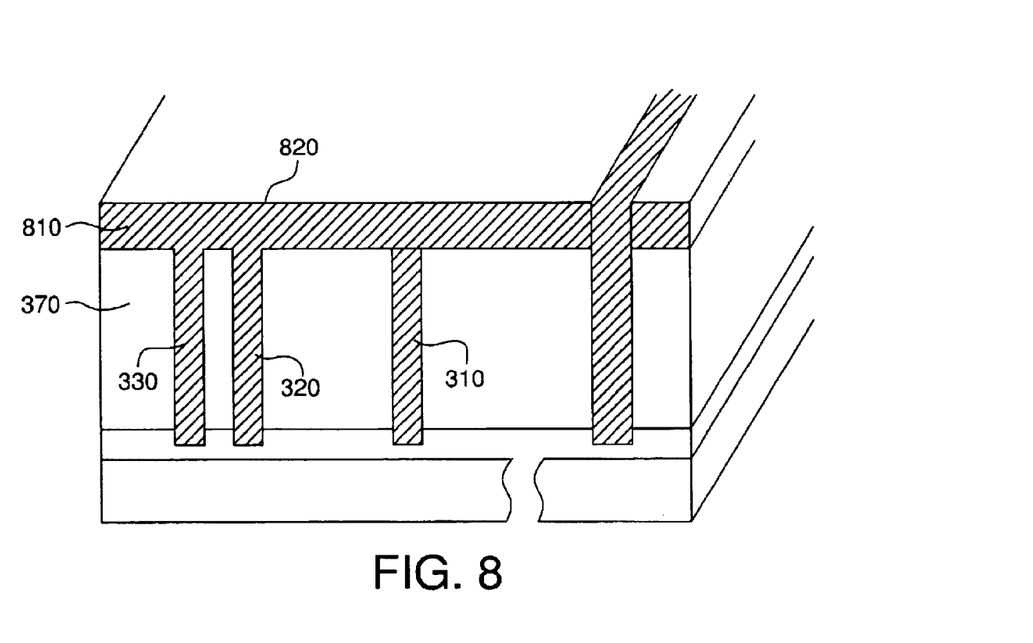
FIG. 8 illustrates a cross-sectional view of the substrate of FIG. 7, wherein another layer of resist is deposited.

In FIG. 8, the second resist layer 810 is formed on the insulating layer 370 to provide a planarized surface 820 of resist material for the following photomasking of trenches. After deposition of the first resist layer 410, removal of the first resist layer 410 down to approximately the surface of the insulating layer 370, and deposition of the second resist layer 810, the difference of topography between the area of dense vias 320–340 and the area of isolated via 310 becomes negligible. That is to say, the uniform topography surface 820 of the second resist layer 810 would be suitable for the following photomask of trenches. Any suitable photolithographic technique can be used to pattern trenches on the resist layer 810.

Figure 9A:
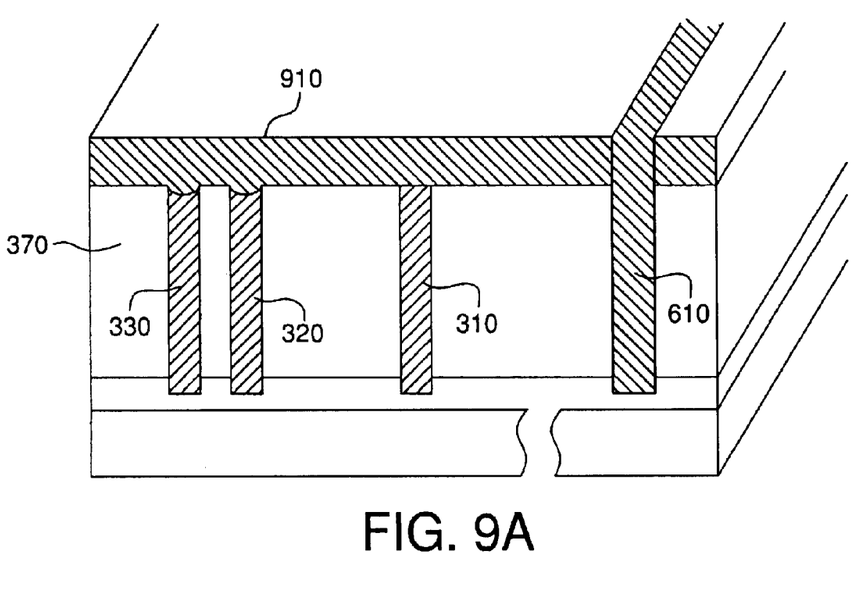
FIGS. 9A and 9B illustrate cross-sectional views of the substrate of FIG. 7, wherein a layer of sacrificial material is formed and then partially removed.
Figure 9B:
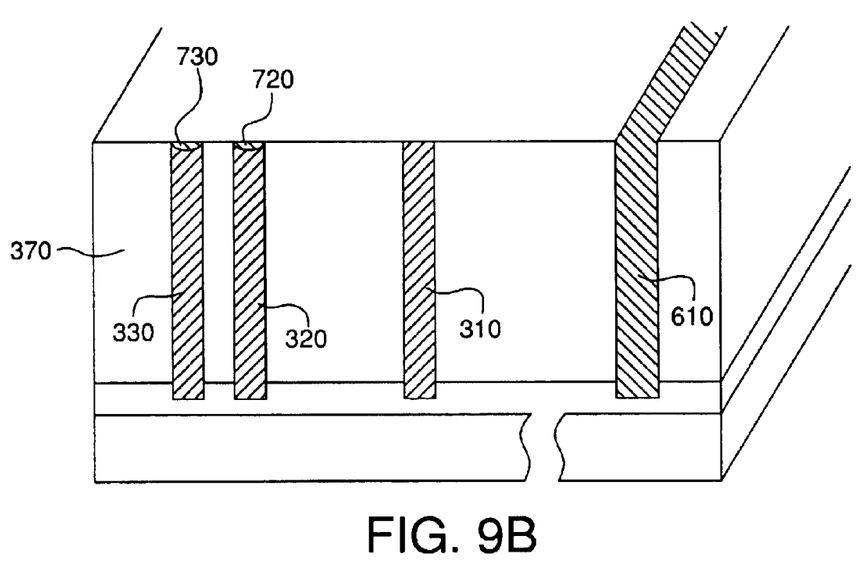

In alternative embodiment as shown in FIGS. 9A and 9B, to further ensure the uniform topography surface 820 is obtained, a layer of sacrificial material 910 is formed on the insulating 370 after the first resist layer 410 is removed to approximately the surface of the insulating layer 370. The layer of sacrificial material 910 fills up the trench-like structure 610 and shallower concave surfaces 720 and 730. The layer of sacrificial material 910 is then removed to approximately the surface of the insulating layer 370. The sacrificial material can be resist material or the like. The sacrificial material helps smoothen the surface although it is not used to pattern a trench. The layer of sacrificial material can be deposited and etched back a desired number of times. Afterwards, the second resist layer 810 as shown in FIG. 8 is formed to pattern a trench.

Figure 10A:
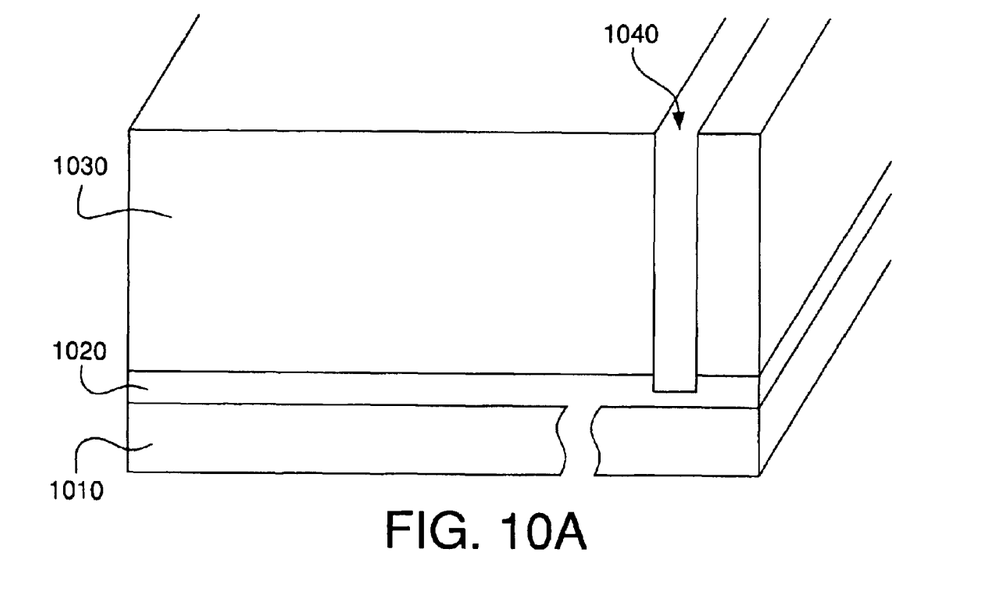
FIG. 10A–10D illustrate cross-sectional views of a substrate during various steps of a damascene process according to some other embodiments of the present invention.
Figure 10B:
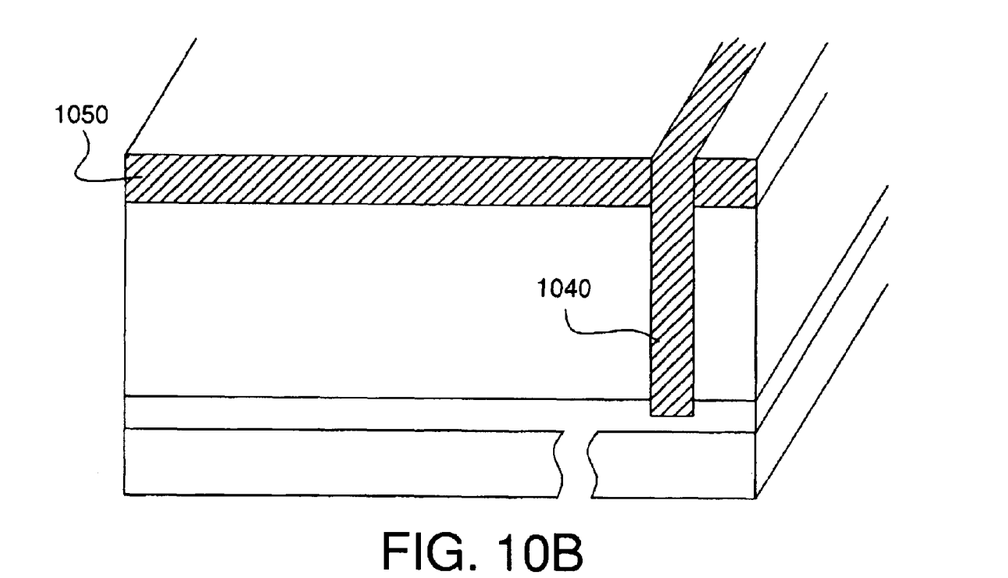
Figure 10C:
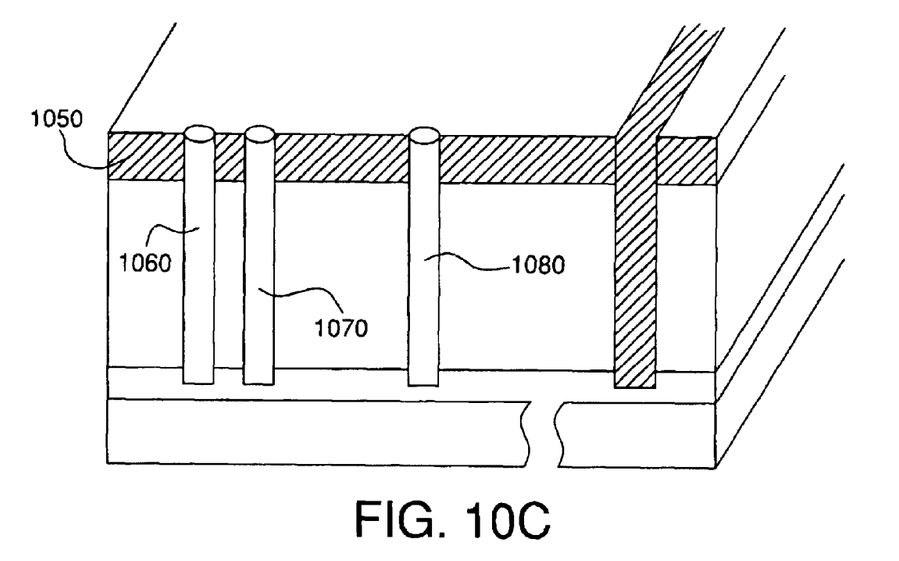
Figure 10D:
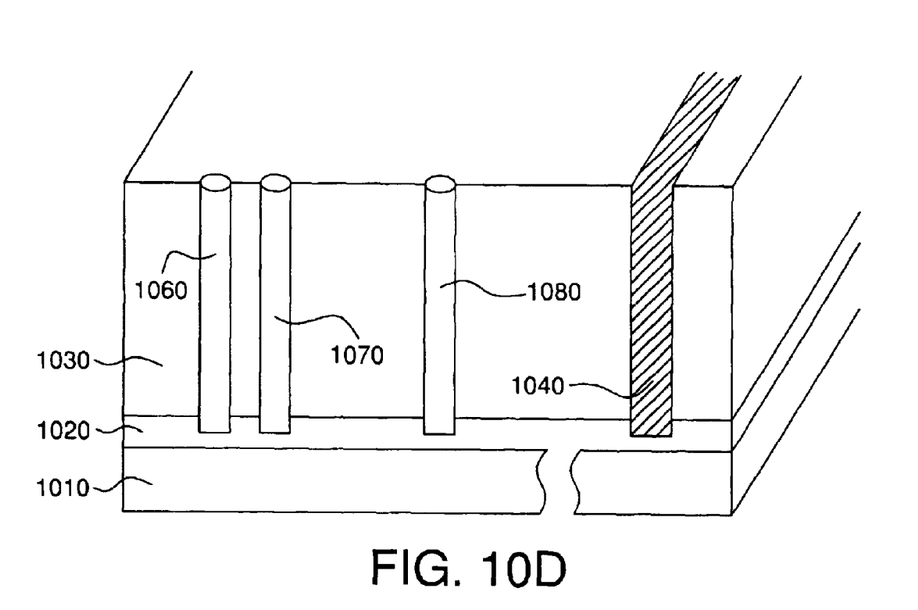

In other embodiments of the present invention, at least one trench-like structure is formed before at least one via is formed. FIGS. 10A–10D illustrate damascene processes of forming a trench-like structure first and then forming three vias. Many details that is the same as aforementioned description are still applied in this portion although they are omitted to avoid redundancy. In FIG. 10A, an insulating layer 1030 is deposited over an etch stop layer 1020. The etch stop layer 1020 is deposited on a conductive interconnect layer 1010. The conductive interconnect layer 1010, in some embodiments, can be separated into several regions such as a circuit region and a seal ring region. A trench-like structure 1040 in a seal ring area is formed. In FIG. 10B, a resist layer 1050 is formed on the insulating layer 1030 and substantially fill the trench-like structure 1040. In FIG. 10C, through exposure, development, and etching, three vias are formed in the insulating layer 1030 over the circuit region of the conductive interconnect layer 1010. In FIG. 10D, the remaining resist of the layer 1050 is removed. Vias are formed separately from trench-like structures. As a result, differences of etching rate between trench-like structures and vias, which may cause trench-like structures to punch through the etch stop layer 1020 and expose the conductive interconnect layer 1010 such as a copper layer, do not generate any problem.

Integrated circuits can thus be manufactured by the aforementioned methods.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising the steps of:

providing an insulating layer overlying a layer of conductive material;

forming at least one via in said insulating layer;

forming a first resist layer on the surface of said insulating layer, having a resist material substantially filling said via;

patterning at least one trench-like structure on said first resist layer; and etching said insulating layer using said patterned first resist layer as a mask to produce said trench-like structure.

2. The method of claim 1 further comprising:

removing said first resist layer to approximately the surface of said insulating layer; and forming a second resist layer on said insulating layer.

3. The method of claim 1 further comprising:

removing said first resist layer to approximately the surface of said insulating layer;

forming a layer of sacrificial material on said insulating layer;

removing said layer of sacrificial material to approximately the surface of said insulating layer; and forming a second resist layer on said insulating layer.

4. The method of claim 1 further comprising:

forming an etch stop layer between said layer of conductive material and said insulating layer.

5. The method of claim 1 wherein said trench-like structure is a seal ring.

6. The method of claim 1 wherein said via does not expose said layer of conductive material.

7. The method of claim 1 wherein said trench-like structure does not expose said layer of conductive material.

8. The method of claim 1 wherein said step of forming at least one via in said insulating layer, comprises the step of forming multiple vias including an area of dense vias and an area of at least one isolated via.

9. The method of claim 2 further comprising:

patterning at least one trench on said second resist layer.

10. The method of claim 3 further comprising:

patterning at least one trench on said second resist layer.

11. The method of claim 8 further comprising:

patterning at least one trench on said second resist layer.

12. A method comprising the steps of:
- providing an insulating layer overlying a layer of conductive material;
- forming at least one trench-like structure in said insulating layer;
- forming a first resist layer on the surface of said insulating layer, having a resist material substantially filling said trench-like structure;
- patterning at least one via on said first resist layer; and
- etching said insulating layer using said patterned first resist layer as a mask to produce said via.

13. The method of claim 12 further comprising:
- forming an etch stop layer between said layer of conductive material and said insulating layer.

14. The method of claim 12 wherein said trench-like structure is a seal ring.

15. The method of claim 12 wherein said via does not expose said layer of conductive material.

16. The method of claim 12 wherein said trench-like structure does not expose said layer of conductive material.

17. A method comprising the steps of:
- providing an insulating layer overlying a layer of conductive material;
- forming at least one trenc-like structure i said insulating layer wherein said trench-like structure does not expose said layer of conductive material;
- forming a first resist layer o the surface of said insulating layer, having a resist meterial substantially filling said trench-like structure;
- patterning at least one via on said first resist layer; and
- etching said via.

* * * * *

UNITED STATES PATENT AND TRADEMARK OFFICE
CERTIFICATE OF CORRECTION

PATENT NO. : 6,960,496 B2
DATED : November 1, 2005
INVENTOR(S) : Chao-Cheng Chen et al.

It is certified that error appears in the above-identified patent and that said Letters Patent is hereby corrected as shown below:

<u>Column 8,</u>
Line 8, delete "trenc-like structure i" and insert -- trench-like structure in --.
Line 11, delete "o" and insert -- on --.
Line 12, delete "meterial" and insert -- material --.

Signed and Sealed this

Second Day of May, 2006

JON W. DUDAS
*Director of the United States Patent and Trademark Office*